(12) United States Patent
Yegnashankaran

(10) Patent No.: US 7,646,064 B1
(45) Date of Patent: Jan. 12, 2010

(54) SEMICONDUCTOR DIE WITH ALUMINUM-SPIKED HEAT PIPES

(75) Inventor: Visvamohan Yegnashankaran, Cupertino, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 310 days.

(21) Appl. No.: 11/588,743

(22) Filed: Oct. 27, 2006

(51) Int. Cl.
*H01L 31/112* (2006.01)

(52) U.S. Cl. ............... 257/355; 257/276; 257/E23.088; 257/E23.105

(58) Field of Classification Search ................ 257/355, 257/350, 276, 69, E23.088, E23.105, 347, 257/712, E23.101, E23.51, E33.075
See application file for complete search history.

(56) References Cited

U.S. PATENT DOCUMENTS

| | | | | |
|---|---|---|---|---|
| 5,955,781 | A * | 9/1999 | Joshi et al. | 257/712 |
| 6,483,147 | B1 * | 11/2002 | Lin | 257/347 |
| 6,573,565 | B2 * | 6/2003 | Clevenger et al. | 257/355 |
| 6,833,587 | B1 * | 12/2004 | Lin | 257/347 |
| 7,075,133 | B1 * | 7/2006 | Padmanabhan et al. | 257/276 |

* cited by examiner

*Primary Examiner*—Thomas L Dickey
*Assistant Examiner*—Fazli Erdem
(74) *Attorney, Agent, or Firm*—Mark C. Pickering

(57) ABSTRACT

A low thermal pathway is provided from the top surface of a silicon substrate to the bottom surface of the silicon substrate by first forming aluminum plugs in the bottom surface of the silicon substrate that contact the silicon substrate and extend up towards the top surface, and then heating the aluminum plugs to a temperature for a period of time sufficient to cause spikes to grow from the sides of the aluminum plugs.

13 Claims, 14 Drawing Sheets

SEMICONDUCTOR DIE WITH ALUMINUM-SPIKED HEAT PIPES

BACKGROUND OF THE INVENTION

1. Field of the Invention

The present invention relates to a semiconductor die and, more particularly, to a semiconductor die with aluminum-spiked heat pipes.

2. Description of the Related Art

Conventional semiconductor die have many advantages, but also suffer from a number of problem areas. One problem area is the removal of heat from the substrate of the die. The high current circuits of present-generation integrated circuits can generate significant amounts of heat in the substrate which, if not removed, can damage or erroneously bias adjacent circuits. One approach to reduce the heat in the substrate of an integrated circuit is to use heat pipes that are formed in the backside of the substrate.

FIG. 1 shows a cross-sectional diagram that illustrates a prior-art semiconductor die 100 with backside heat pipes. As shown in FIG. 1, die 100 has a conventional structure that includes a p− semiconductor substrate 110, and a number of shallow trench isolation (STI) regions that are formed in substrate 110. Die 100 also includes a p− well 112 and an n− well 114 that are formed in substrate 110. P− well 112, in turn, has a heavier dopant concentration than p− substrate 110.

As further shown in FIG. 1, semiconductor die 100 additionally includes an NMOS transistor 120 and a PMOS transistor 130. NMOS transistor 120 has spaced-apart n+ source and drain regions 122 and 124 that are formed in p− well 112, and a p− channel region 126 that lies between and contacts source and drain regions 122 and 124. NMOS transistor 120 also has a gate oxide layer 128 that is formed on p− well 112 over channel region 126, and a gate G1 that is formed on gate oxide layer 128 over channel region 126.

PMOS transistor 130 has spaced-apart p+ source and drain regions 132 and 134 that are formed in n− well 114, and an n− channel region 136 that lies between and contacts source and drain regions 132 and 134. PMOS transistor 130 also has a gate oxide layer 138 that is formed on n− well 114 over channel region 136, and a gate G2 that is formed on gate oxide layer 138 over channel region 136.

As additionally shown in FIG. 1, die 100 has a conventional interconnect structure that includes a first dielectric layer 150 that is formed on top surface a 110A of substrate 110 over n+ regions 122 and 124, p+ regions 132 and 134, and gates G1 and G2. Further, a large number of contacts 152 are formed through first dielectric layer 150 to make electrical connections with n+ regions 122 and 124, p+ regions 132 and 134, and gates G1 and G2.

The interconnect structure also includes a large number of metal-1 regions 156, such as traces and lines, that are formed on first dielectric layer 150 to make electrical connections with the contacts 152, and a second dielectric layer 160 that is formed on first dielectric layer 150 and the metal-1 regions 156.

In addition, a large number of vias 162 are formed through second dielectric layer 160 to make electrical connections with the metal-1 regions 156, a large number of metal-2 regions 164, such as traces and lines, are formed on second dielectric layer 160 to make electrical connections with the vias 162, and a top dielectric layer 170 is formed on second dielectric layer 160 and the metal-2 regions 164.

To remove heat, semiconductor die 100 additionally includes a number of heat pipes 180 that are formed in substrate 110 to extend from the bottom surface of substrate 110 up into the wells 112 and 114, without touching the top surface of the wells 112 and 114. Each heat pipe 180 can include a metal region 182, such as metal silicide or other metallic materials and combinations, and an electrically isolating material 184, such as oxide, that only partially surrounds metal region 182. Metal region 182 has a side wall 182A and an end or top wall 182B. Isolating material 184, in turn, contacts side wall 182A, which isolates side wall 182A from substrate 110. Isolating material 184, however, does not contact top wall 182B.

In addition, die 100 can include a number of contact regions 186 that are formed in the wells 112 and 114 to correspond with the heat pipes 180. Each contact region 186 contacts the top wall 182B of a heat pipe 180, and has the same conductivity type, but a greater dopant concentration, than the adjoining well.

As further shown in FIG. 1, semiconductor die 100 also includes a number of heat pipes 190 that are formed to extend up from the bottom surface into p− substrate 110. Heat pipes 190 are identical to heat pipes 180 except that heat pipes 190 are shorter and extend into only p− substrate 110. Thus, as above, each heat pipe 190 can include a metal region 192, such as metal silicide or other metallic materials and combinations, and an electrically isolating material 194, such as oxide, that only partially surrounds metal region 192. Metal region 192 has a side wall 192A and an end or top wall 192B. Isolating material 194, in turn, contacts side wall 192A, which isolates side wall 192A from substrate 110. Isolating material 194, however, does not contact top wall 192B.

In addition, semiconductor die 100 can include a number of contact regions 196 that are formed in substrate 110 to correspond with the heat pipes 190. Each contact region 196 contacts the top wall 192B, and has the same conductivity type, but a greater dopant concentration than, the adjoining region of substrate 110.

In operation, significant amounts of heat can be generated in the channel regions 126 and 136 when transistors 120 and 130 are high current transistors, such as driver transistors. Heat pipes 180 and 190, in turn, provide a thermal path that reduces the build up of heat in substrate 110. (Pipes 180 and 190 also provide a means for setting the voltage on p− substrate 110, p− well 112, and n− well 114.)

Although heat pipes 180 and 190 reduce the build up of heat in the high-current regions of the substrate, there is a need for additional approaches to removing heat from the high-current regions of the substrate.

DETAILED DESCRIPTION OF THE INVENTION

Figure 1:
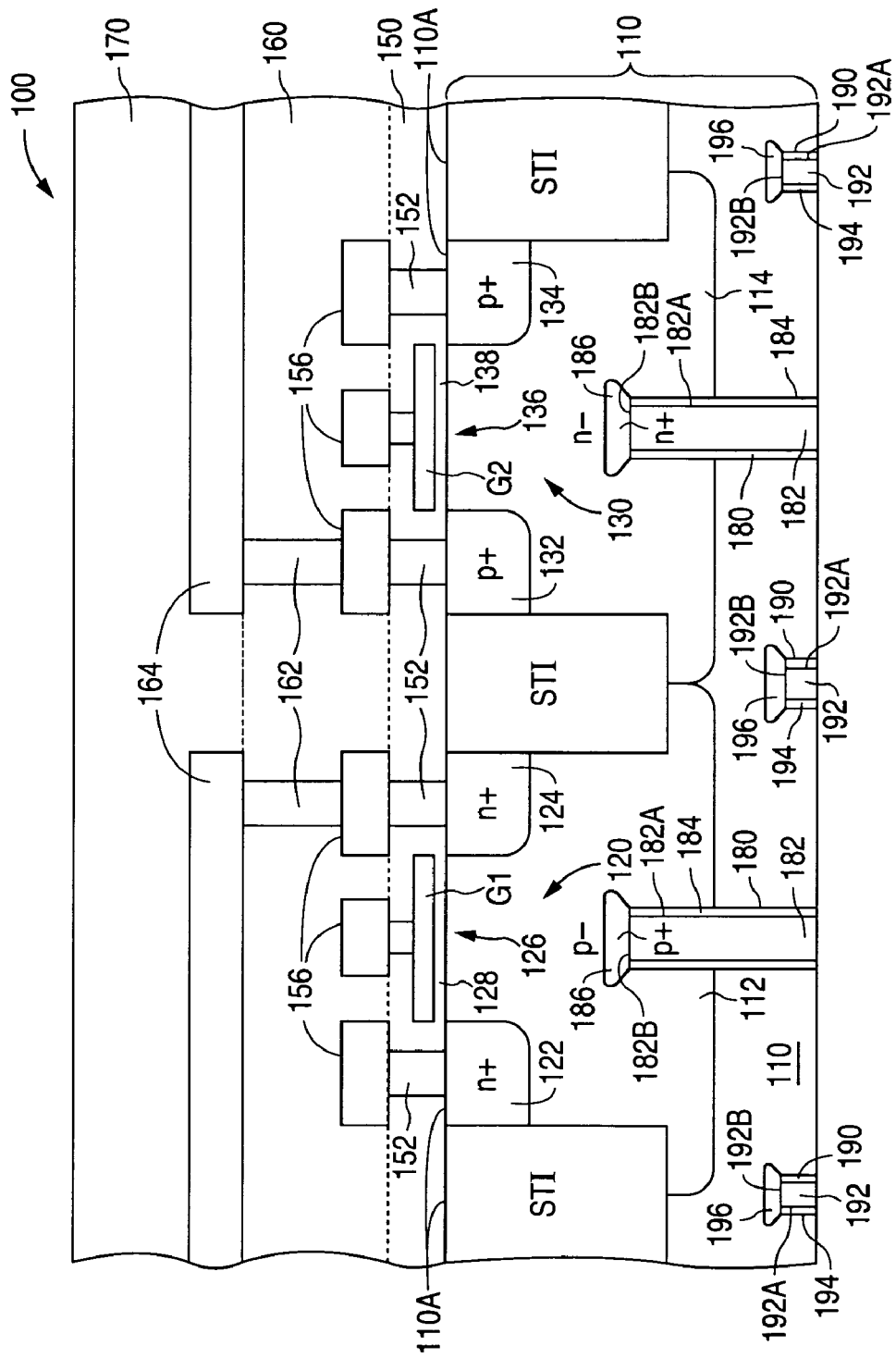
FIG. 1 is a cross-sectional diagram illustrating a prior-art semiconductor die 100 with backside heat pipes.
Figure 2:
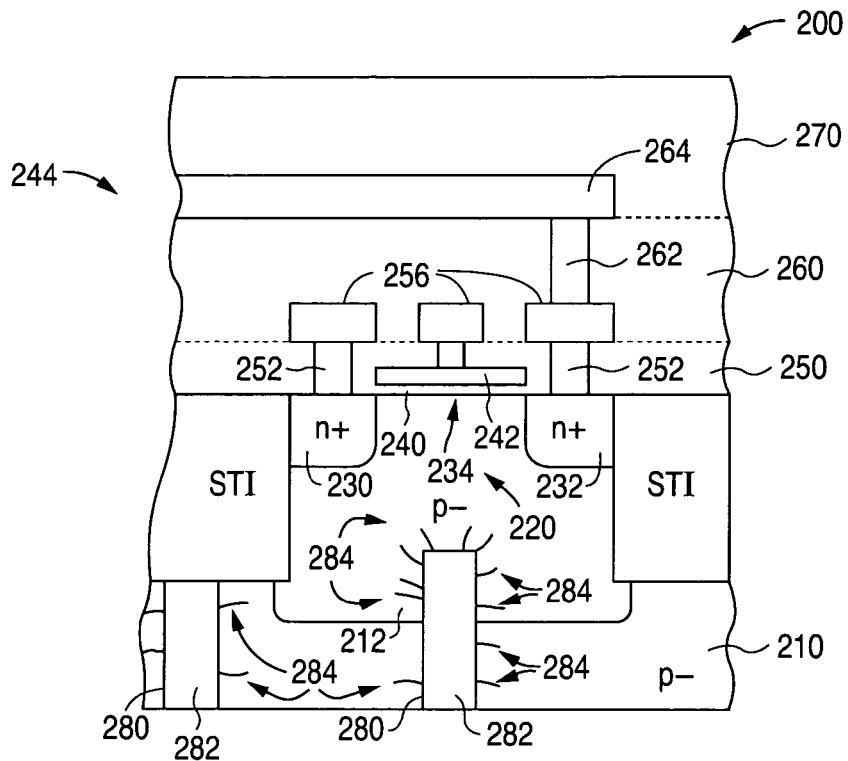
FIG. 2 is a cross-sectional view illustrating an example of a semiconductor die 200 in accordance with the present invention.

FIG. 2 shows a cross-sectional view that illustrates an example of a semiconductor die 200 in accordance with the present invention. As described in greater detail below, semiconductor die 200 utilizes an aluminum-spiked heat pipe to remove heat from thermal hot spots that lie near the surface of the substrate of semiconductor die 200.

As shown in FIG. 2, die 200 includes a p– silicon substrate 210, and a number of shallow trench isolation (STI) regions that are formed in substrate 210. Die 200 also includes a p– well 212 that is formed in substrate 210 to have a dopant concentration greater than a dopant concentration of p– substrate 210.

As further shown in FIG. 2, semiconductor die 200 additionally includes an NMOS transistor 220. NMOS transistor 220 has spaced-apart n+ source and drain regions 230 and 232 that are formed in p– well 212, and a p– channel region 234 that lies between and contacts n+ source and drain regions 230 and 232. NMOS transistor 220 also has a gate oxide layer 240 that is formed on p– well 212 over channel region 234, and a gate 242 that is formed on gate oxide layer 240 over channel region 234.

As additionally shown in FIG. 2, die 200 has an interconnect structure 244 that includes a first dielectric layer 250 that is formed over p– substrate 210, p– well 212, n+ region 230, n+ region 232, and gate 242. Further, a large number of contacts 252 are formed through first dielectric layer 250 to make electrical connections with n+ region 230, n+ region 232, and gate 242.

The interconnect structure also includes a large number of metal-1 regions 256, such as traces and lines, that are formed on first dielectric layer 250 to make electrical connections with the contacts 252, and a second dielectric layer 260 that is formed on first dielectric layer 250 and the metal-1 regions 256.

In addition, a large number of vias 262 are formed through second dielectric layer 260 to make electrical connections with the metal-1 regions 256, a large number of metal-2 regions 264, such as traces and lines, are formed on second dielectric layer 260 to make electrical connections with the vias 262, and a top dielectric layer 270 is formed on second dielectric layer 260 and the metal-2 regions 264. (Interconnect structure 244 can include any number of metal layers.)

In accordance with the present invention, semiconductor die 200 additionally includes a number of aluminum-spiked heat pipes 280 that are formed in substrate 210 to extend from the bottom surface of substrate 210 up to near the top surface of substrate 210, without touching the top surfaces of any of the p– type regions, i.e., p– substrate 210 and p– well 212.

In the FIG. 2 example, each heat pipe 280 has a vertical base region 282 that directly contacts p– silicon substrate 210, and extends away from the bottom surface of p– silicon substrate 210. One heat pipe 280 extends up towards the top surface of p– silicon substrate 210 without touching the top surface of p– silicon substrate, while another heat pipe extends up into p– well 212 without touching the top surface of p– well 212. In addition, each heat pipe 280 includes a number of spikes 284 that extend away in all directions from base region 282 into the surrounding silicon material.

In the present invention, each heat pipe 280 is implemented with only aluminum or an aluminum alloy that exhibits aluminum spiking. Aluminum spiking is a well-known phenomena that occurs when aluminum in direct contact with silicon is subject to process temperatures of approximately 900° C. or more. When this temperature is reached, spikes 284 begin to grow out of base region 282 in a manner somewhat similar to the growth of carbon nanotubes.

The spikes 284 have good thermal characteristics and, as a result, provide a very low thermal pathway from hot spots near the top surface of substrate 210 or p– well 212 to base region 282 which, in turn, provides a very low thermal pathway to the backside of substrate 210. Thus, the phenomena that leads to junction spiking, where a doped region is electrically shorted to the adjoining the well or substrate by aluminum, is instead used to provide a low thermal pathway in the present invention.

Figure 3A:
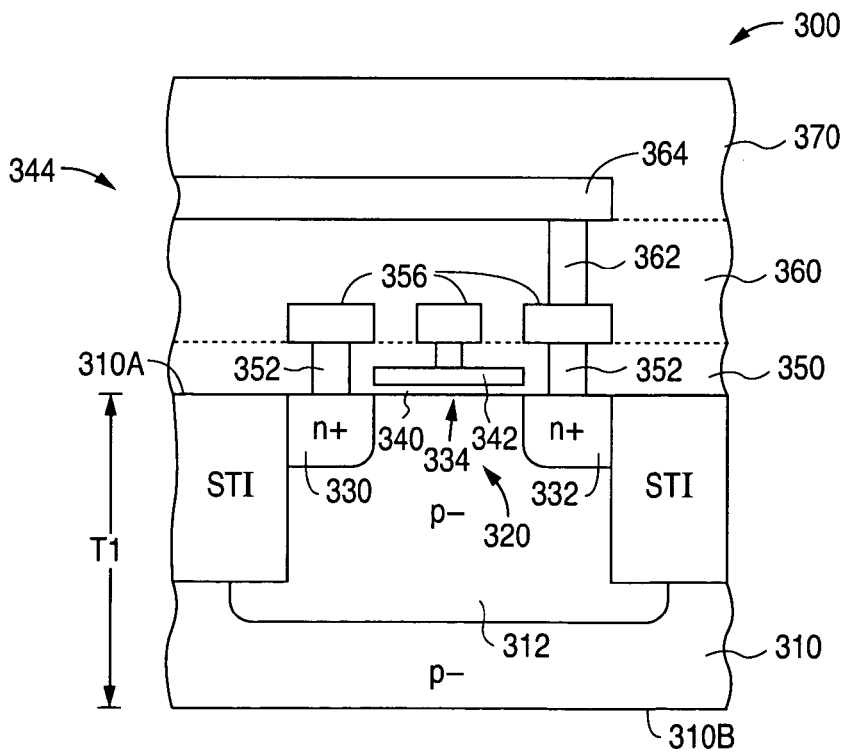
FIGS. 3A-3G are a series of cross-sectional views illustrating an example of a method of forming a die in accordance with the present invention.

FIGS. 3A-3G show a series of cross-sectional views that illustrate an example of a method of forming a die in accordance with the present invention. As shown in FIG. 3A, the method utilizes a semiconductor die 300 that has been conventionally formed.

Semiconductor die 300 includes a p– silicon substrate 310 that has a top surface 310A, a bottom surface 310B, and a thickness T1 of approximately $500\text{-}750 \times 10^{-6}$ m (500-750 microns or approximately 20-30 mils). Further, die 300 includes a number of shallow trench isolation (STI) regions that are located in substrate 310, and a p– well 312 that is located in p– substrate 310. P– well 312, in turn, has a dopant concentration greater than a dopant concentration of p– substrate 310.

As further shown in FIG. 3A, semiconductor die 300 includes an NMOS transistor 320. NMOS transistor 320 has spaced-apart n+ source and drain regions 330 and 332 that are formed in p– well 312, and a p– channel region 334 that contacts and lies between n+ source and drain regions 330 and 332. NMOS transistor 320 also has a gate oxide layer 340 that is formed on p– well 312 over channel region 334, and a gate 342 that is formed on gate oxide layer 340 over channel region 334.

As additionally shown in FIG. 3A, die 300 has an interconnect structure 344 that includes a first dielectric layer 350 that is formed on top surface 310A of p– substrate 310 over p– well 312, n+ region 330, n+ region 332, gate 342, and similar conductive regions. Die 300 further includes a large number of contacts 352 that are formed through first dielectric layer 350 to make electrical connections with n+ region 330, n+ region 332, and gate 342.

Semiconductor die 300 also includes a large number of metal-1 regions 356, such as traces and lines, that are formed on first dielectric layer 350 to make electrical connections with the contacts 352, and a second dielectric layer 360 that is formed on first dielectric layer 350 and the metal-1 regions 356.

Die 300 further includes a large number of vias 362 that are formed through second dielectric layer 360 to make electrical connections with the metal-1 regions 356, a large number of metal-2 regions 364, such as traces and lines, that are formed on second dielectric layer 360 to make electrical connections with the vias 362, and a top dielectric layer 370 that is formed on second dielectric layer 360 and the metal-2 regions 364. (Interconnect structure 344 can include any number of metal layers.)

Figure 3B:
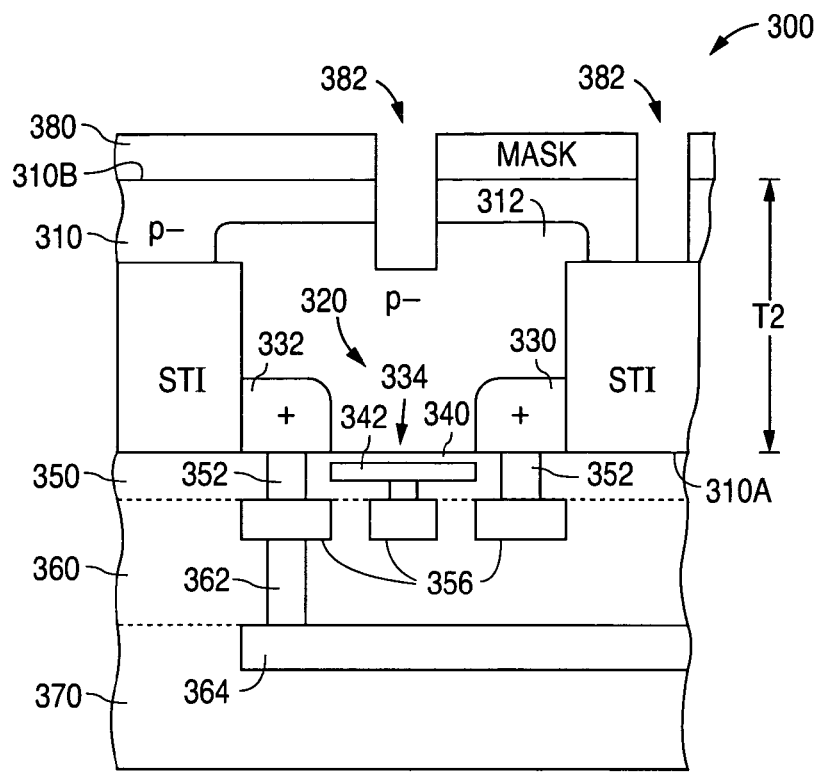

As shown in FIG. 3B, the method begins by back grinding bottom surface 310B of semiconductor die 300 until substrate 310 has an etchable thickness T2 that lies in the range of approximately $12\text{-}100 \times 10^{-6}$ m (12-100 microns or approximately 0.5-4 mils). An etchable thickness of silicon is a thickness that can be anisotropically etched through in a relatively short period of time.

For example, an etchable thickness of silicon of $25 \times 10^{-6}$ m (25 microns or 1 mil) can be anisotropically etched through in a reactive ion etcher in a relatively short period of time, e.g., 30 minutes. By contrast, approximately eight hours are required to etch through silicon that is $500 \times 10^{-6}$ m (500 microns or 20 mils) thick.

Following this, a mask 380, such as a hard mask, is formed and patterned on bottom surface 310B of substrate 310. Once mask 380 has been formed and patterned, the exposed regions of substrate 310 are etched until a number of openings 382 are formed in p− substrate 310. The openings 382 extend up towards top surface 310A of p− substrate 310, without touching top surface 310A of p− substrate 310, and also into p− well 312 without touching the top surface of p− well 312. Mask 380 is then removed.

Figure 3C:
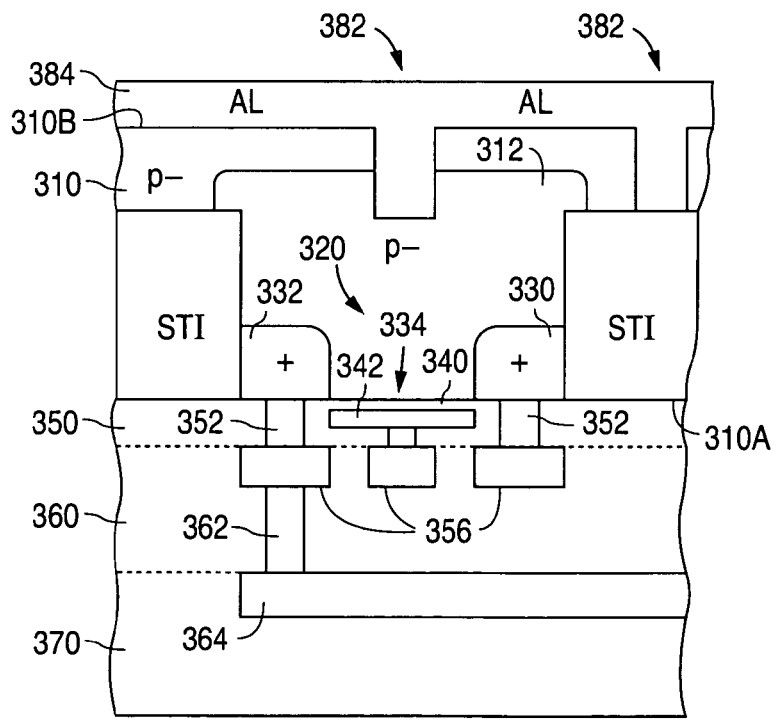
Figure 3D:
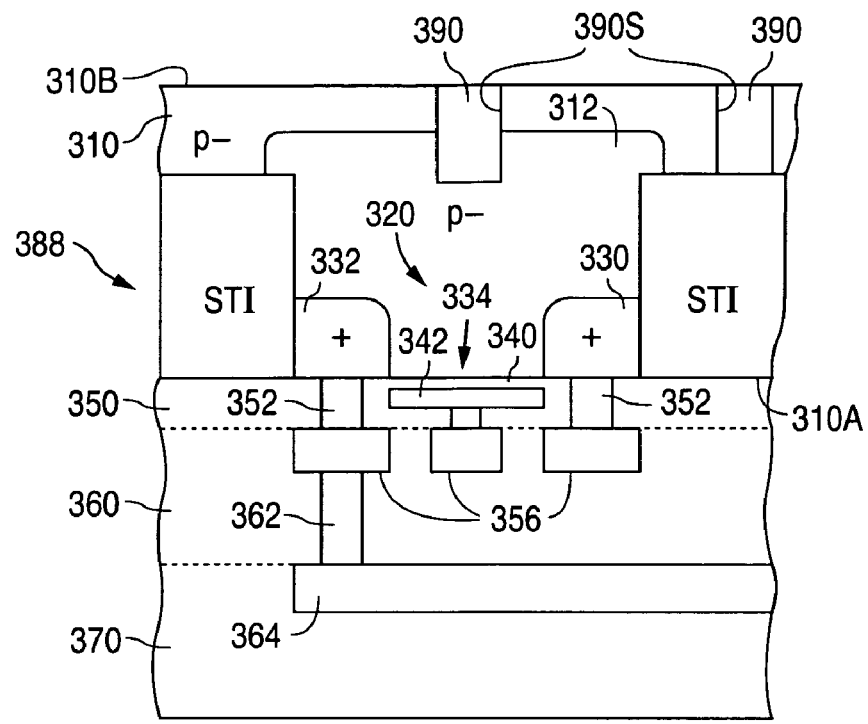

As shown in FIG. 3C, after the openings 382 have been formed, aluminum 384 (or an aluminum alloy that is subject to spiking) is deposited on bottom surface 310B and in openings 382 to fill up openings 382. As shown in FIG. 3D, once openings 382 have been filled, the overlying regions of aluminum 384 are removed, such as by back grinding, to form a die 388 that has a number of aluminum plugs 390 that directly contact p− silicon substrate 310, with some plugs 390 also contacting p− well 312. Plugs 390, in turn, each have a side wall 390S.

Figure 3E:
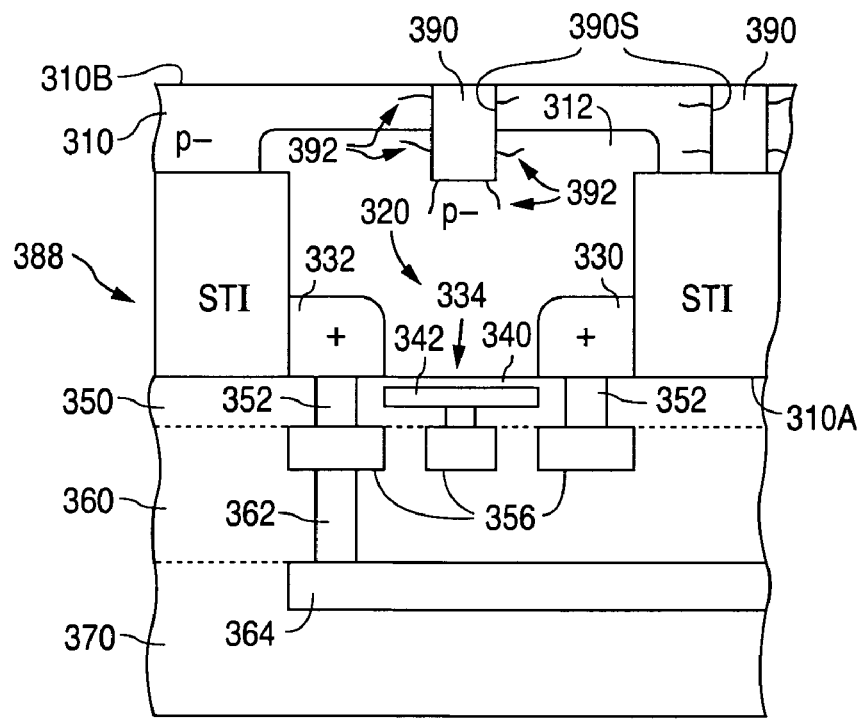

Next, as shown in FIG. 3E, die 300 is heated to a temperature of approximately 900° C. or more for a predetermined period of time. When this temperature is reached, spikes 392 begin to grow out of the side walls 390S of aluminum plugs 390 in all directions, as well as away from the end of the plug that contacts p− well 312. Following this, conventional back-end processing steps are followed to complete the fabrication of die 300. As a result, die 388 is similar to die 200.

Figure 3F:
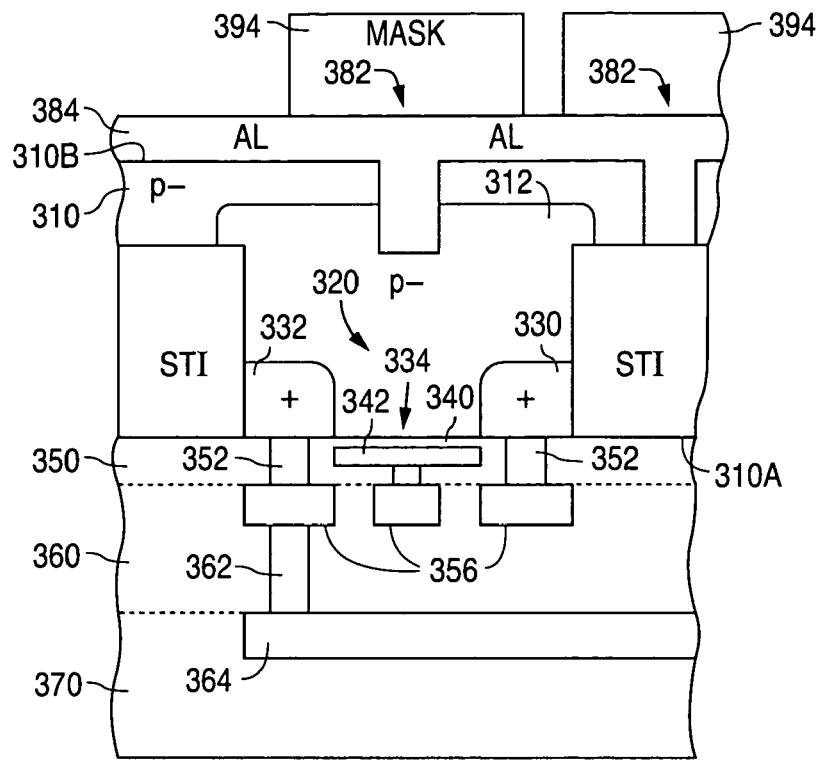

Optionally, as shown in FIG. 3F, rather than back grinding, aluminum 384 can be selectively removed by forming a mask 394 on aluminum 384 that protects the aluminum-filled openings 382 and the surrounding area. Following the formation of mask 394, the exposed regions of aluminum 384 are etched until aluminum 384 has been removed from the bottom surface 310B of p− substrate 310. Mask 394 is then removed, and the process continues as described above.

Figure 3G:
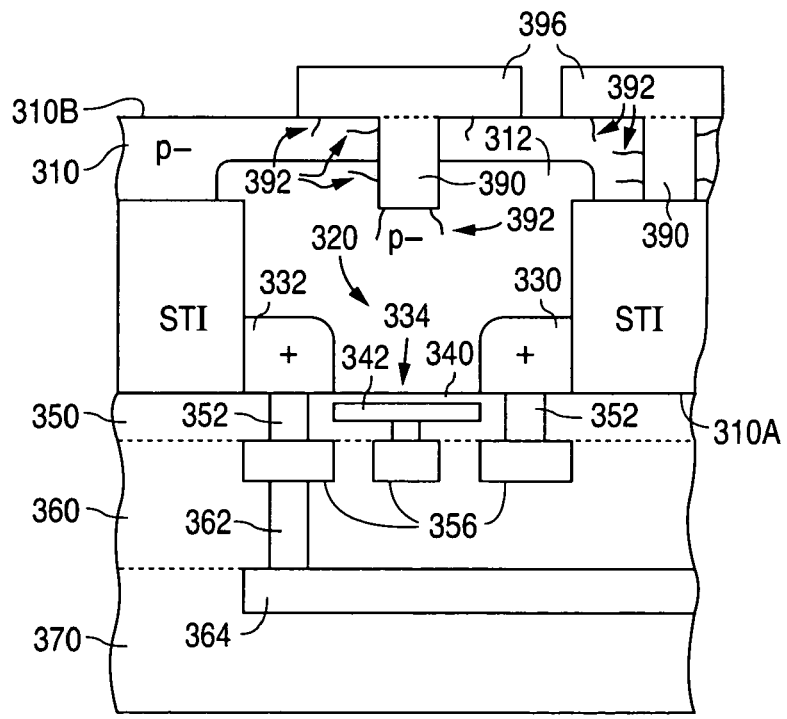

As shown in FIG. 3G, the aluminum etch forms large spaced-apart regions 396 on bottom surface 310B of substrate 310 that are connected to the aluminum plugs 390. Regions 396 provide a large surface area which, in turn, increases the heat radiation efficiency of aluminum plugs 390 and spikes 392, which form aluminum-spiked heat pipes. In addition, as further shown in FIG. 3G, spikes 392 also extend away from regions 396 following the 900° C. heat treatment.

Figure 4:
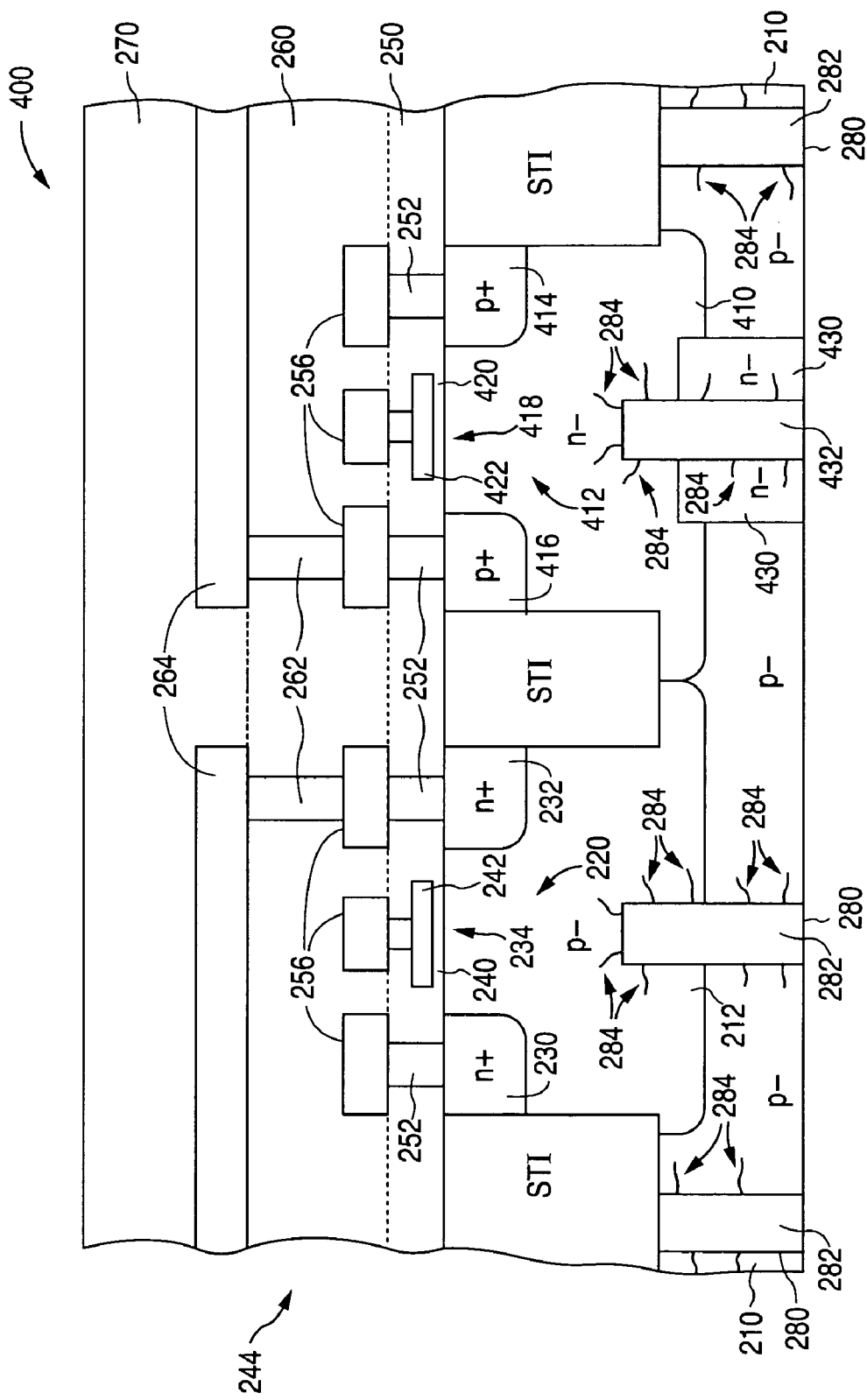
FIG. 4 is a cross-sectional diagram illustrating an example of a semiconductor die 400 in accordance with an alternate embodiment of the present invention.

FIG. 4 shows a cross-sectional diagram that illustrates an example of a semiconductor die 400 in accordance with an alternate embodiment of the present invention. Semiconductor die 400 is similar to semiconductor die 200 and, as a result, utilizes the same reference numerals to designate the structures which are common to both die.

As shown in FIG. 4, semiconductor die 400 differs from semiconductor die 200 in that semiconductor die 400 also includes an n− well 410 that is located in p− silicon substrate 210, and a PMOS transistor 412 that is connected to the interconnect structure 244. PMOS transistor 412 has spaced-apart p+ source and drain regions 414 and 416 that are formed in n− well 410, and an n− channel region 418 that lies between and contacts p+ source and drain regions 414 and 416. PMOS transistor 412 also has a gate oxide layer 420 that is formed on n− well 410 over channel region 418, and a gate 422 that is formed on gate oxide layer 420 over channel region 418.

In accordance with the present invention, semiconductor die 400 also includes an n− junction region 430 laterally surrounded by p− silicon substrate 210 that extends from the bottom surface of substrate 210 up to contact n− well 410. In addition, semiconductor die 400 additionally includes a number of aluminum-spiked heat pipes 432 that extend from the bottom surface of n− junction region 430 into n− well 410, without touching the top surface of n− well 410. Heat pipes 432 are otherwise identical to heat pipes 280.

Thus, n− junction region 430 provides a means of utilizing an aluminum-spiked heat pipe in a well of a first conductivity type that contacts a substrate or similar region of an opposite conductivity type. Thus, although n− junction region 430 increases the surface area of n− well 410, thereby slightly increasing the leakage current, n− junction region 430 protects heat pipes 432 from shorting n− well 410 to p− substrate 210.

FIGS. 5A-5H show a series of cross-sectional views that illustrate an example of a method of forming a die in accordance with the present invention. The method utilizes a semiconductor die 500 that has been conventionally formed. Semiconductor die 500 is similar to semiconductor die 300 and, as a result, utilizes the same reference numerals to describe the structures that are common to both methods.

Figure 5A:
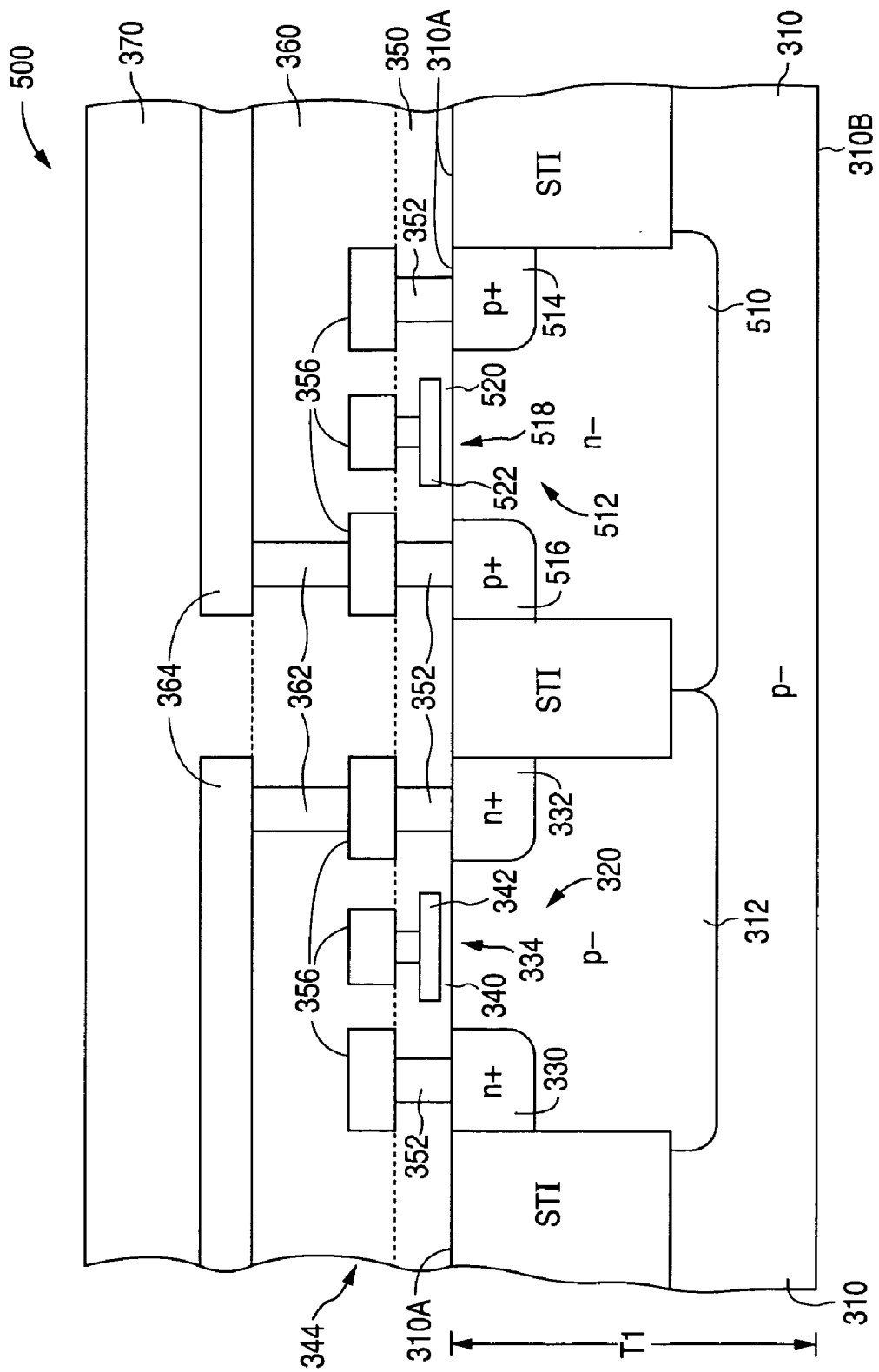
FIGS. 5A-5H are a series of cross-sectional views illustrating an example of a method of forming a die in accordance with the present invention.

As shown in FIG. 5A, semiconductor die 500 differs from semiconductor die 300 in that semiconductor die 500 also includes an n− well 510 that is located in p− silicon substrate 310, and a PMOS transistor 512 that is connected to interconnect structure 344. PMOS transistor 512 has spaced-apart p+ source and drain regions 514 and 516 that are formed in n− well 510, and an n− channel region 518 that lies between and contacts p+ source and drain regions 514 and 516. PMOS transistor 512 also has a gate oxide layer 520 that is formed on n− well 510 over channel region 518, and a gate 522 that is formed on gate oxide layer 520 over channel region 518.

Figure 5B:
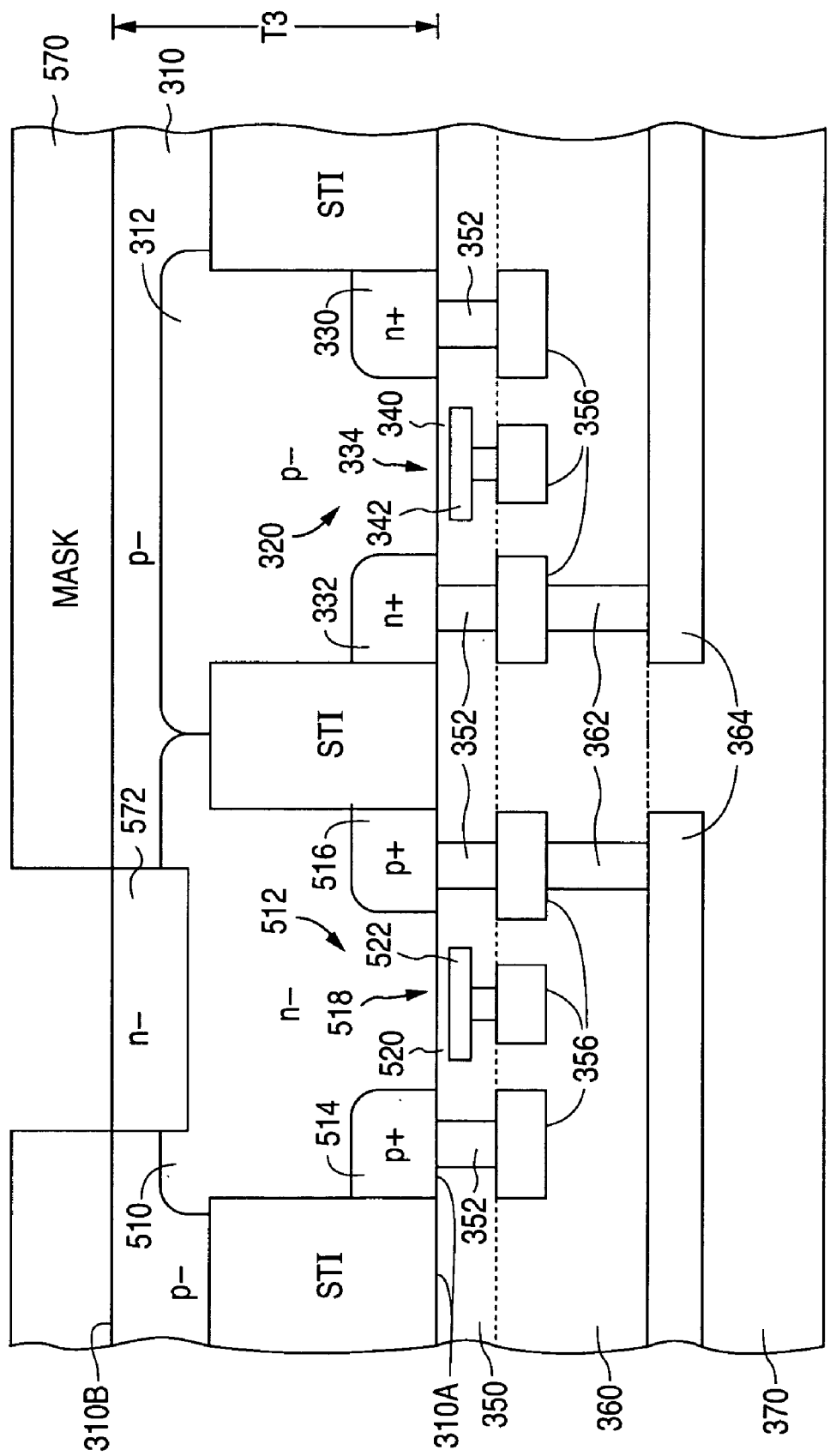

As shown in FIG. 5B, the method begins by back grinding bottom surface 310B of semiconductor die 500 until substrate 310 has an implantable and etchable thickness T3. An implantable thickness of silicon is a thickness wherein dopant atoms can be driven from the backside through p− substrate 310 into n− well 510.

Following this, a mask 570, such as a hard mask, is formed and patterned on bottom surface 310B of substrate 310. Once mask 570 has been formed and patterned, the exposed regions of substrate 310 are implanted with an n− type dopant a number of times with different implant intensities to form a number of spaced-apart n− junction regions 572 that extend continuously from bottom surface 310B through p− substrate 310 into n− well 510, without touching the top surface of n− well 510. Mask 570 is then removed.

Figure 5C:
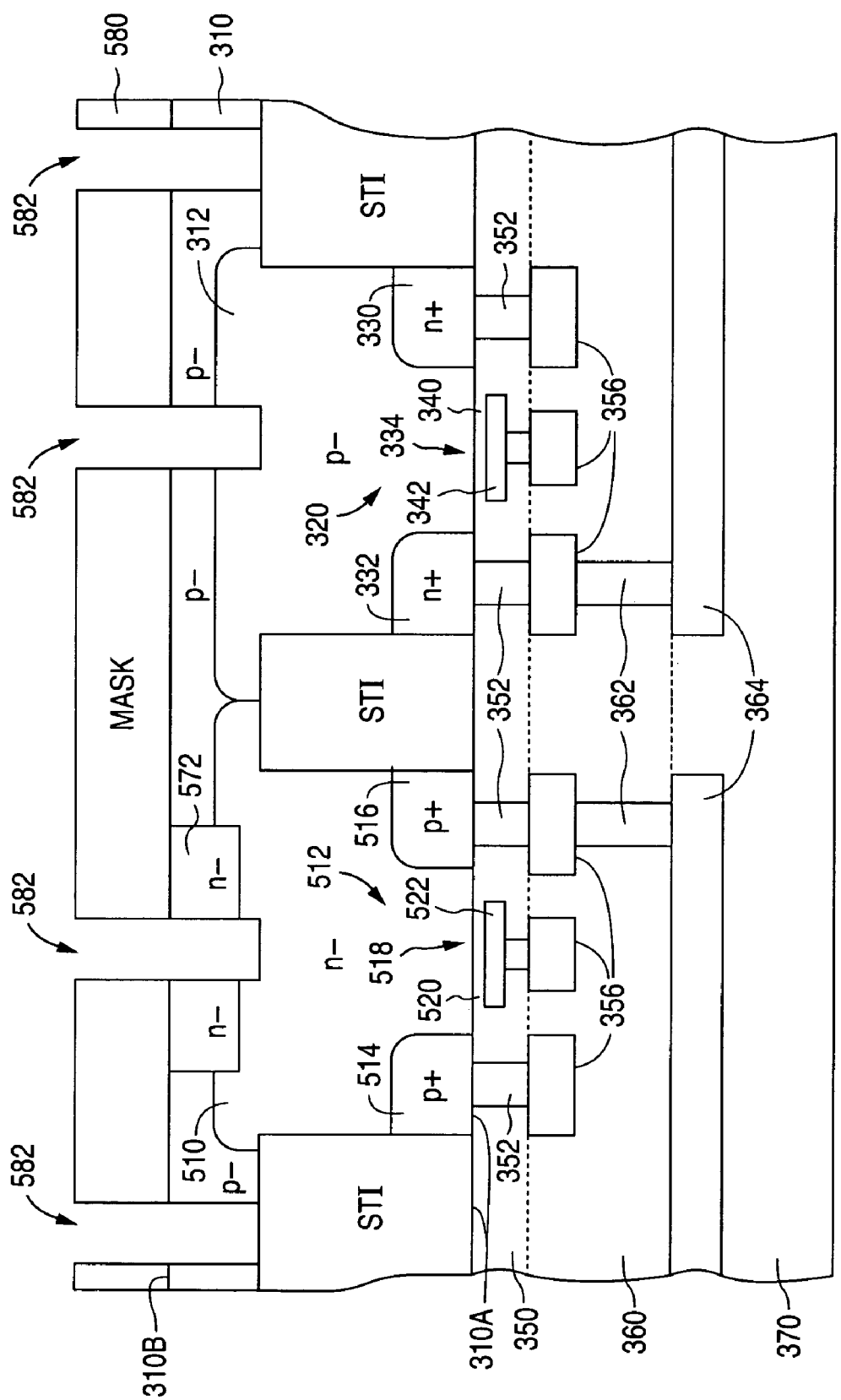

Next, as shown in FIG. 5C, a mask 580, such as a hard mask, is formed and patterned on bottom surface 310B of substrate 310. Once mask 580 has been formed and patterned, the exposed regions of substrate 310 are etched until a number of openings 582 are formed in substrate 310 that extend up from bottom surface 310B of p− substrate 310. Mask 580 is then removed.

Figure 5D:
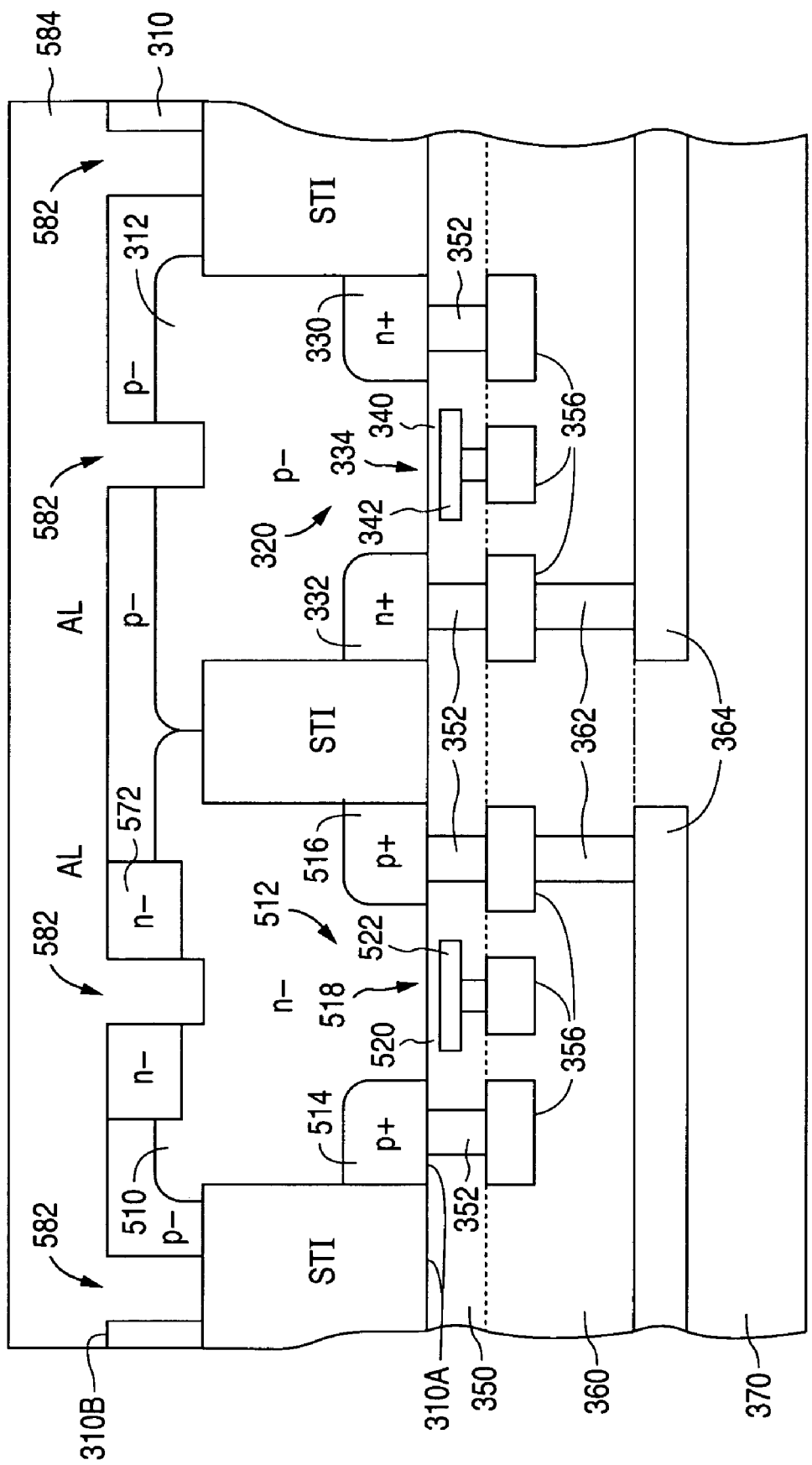
Figure 5E:
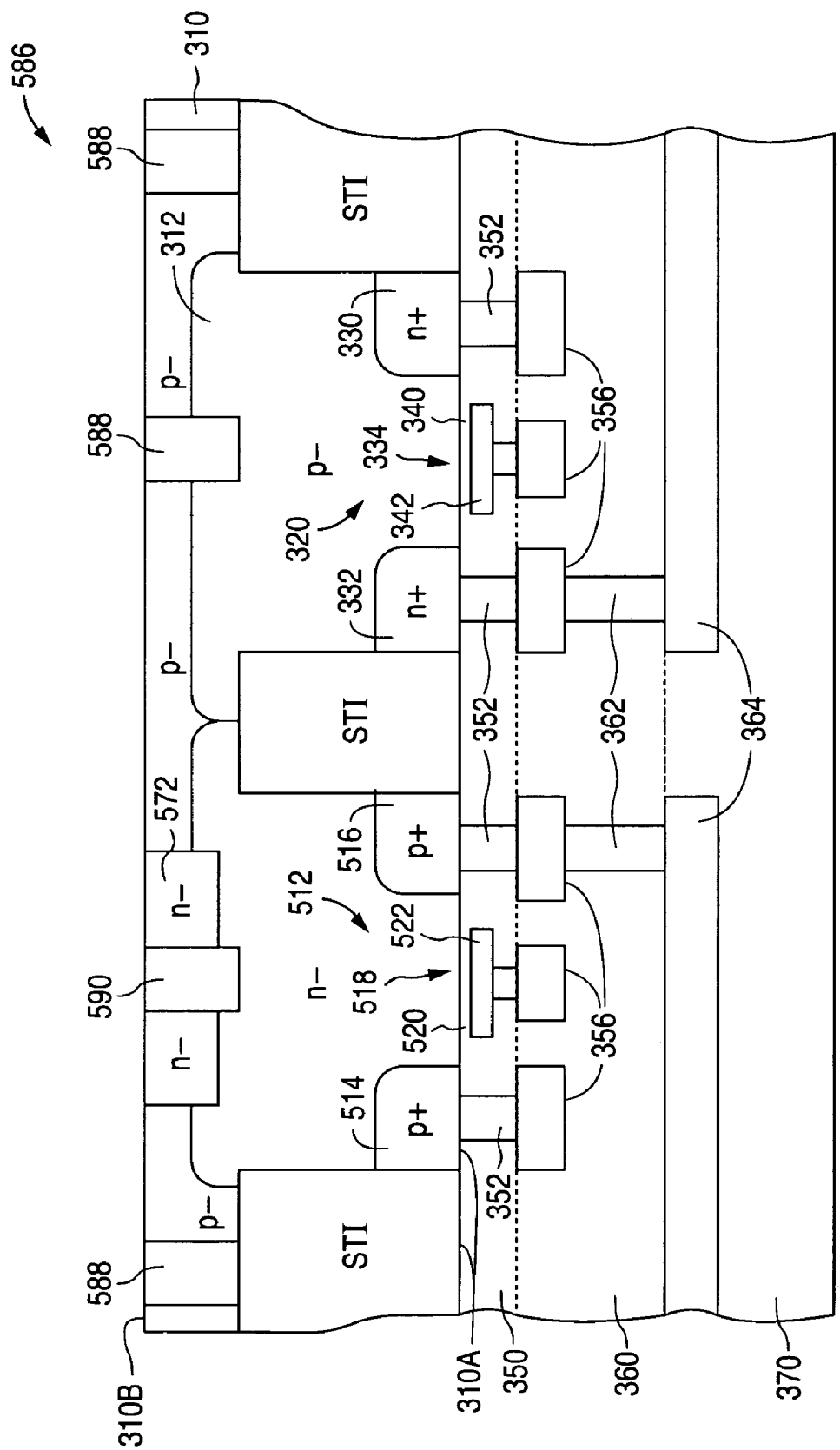

As shown in FIG. 5D, after the openings 582 have been formed, aluminum 584 (or an aluminum alloy that is subject to spiking) is deposited on bottom surface 310B and in openings 582 to fill up openings 582. As shown in FIG. 5E, once openings 582 have been filled, the overlying regions of aluminum 584 are removed, such as by back grinding, to form a die 586 that has a number of aluminum plugs 588 that directly contact p− silicon substrate 310, and a number of aluminum plugs 590 that directly contact n− junction region 572 and n− well 510.

Figure 5F:
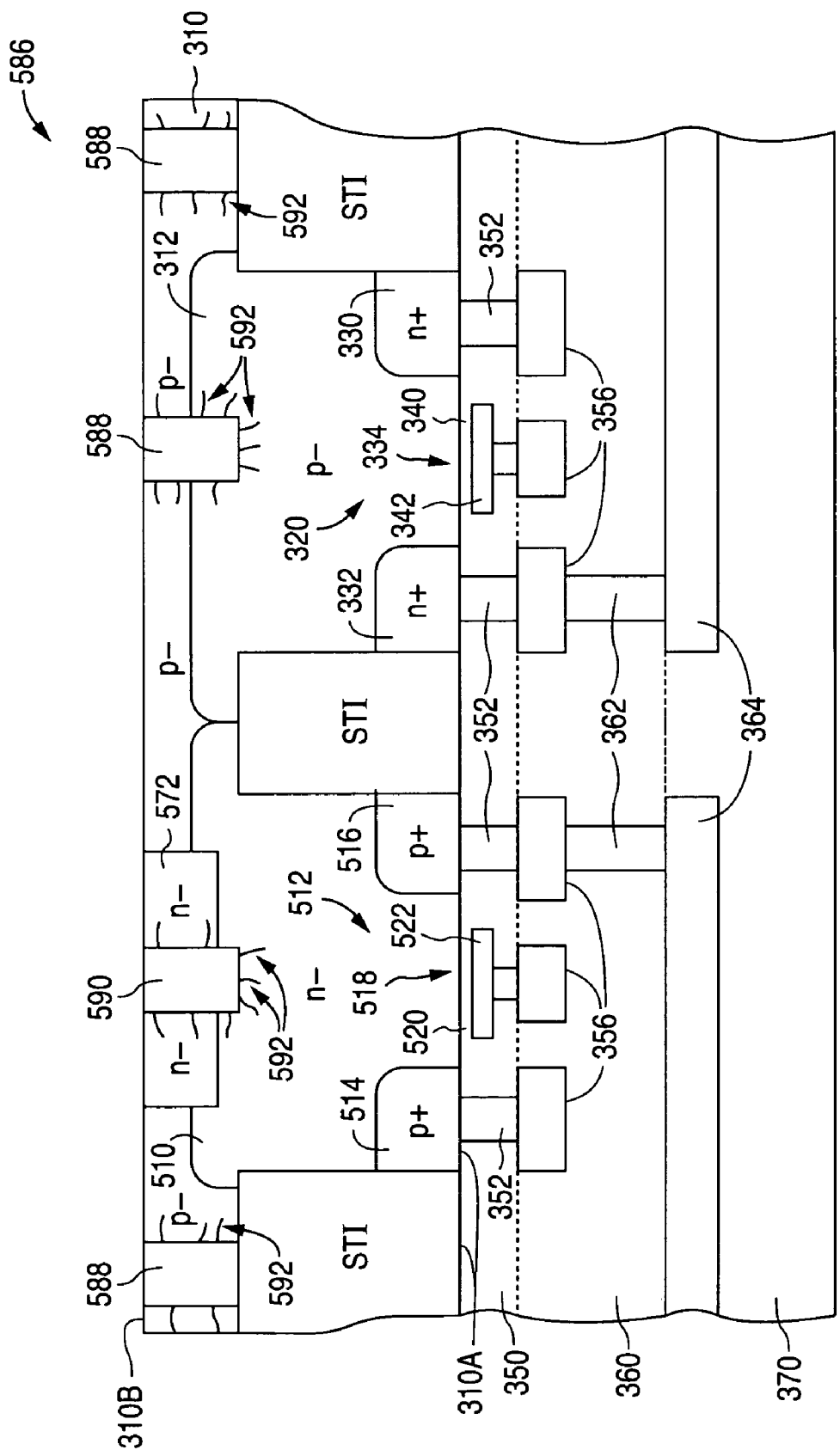

Next, as shown in FIG. 5F, die 500 is heated to a temperature of approximately 900° C. or more for a predetermined period of time. When this temperature is reached, spikes 592 begin to grow out of aluminum plugs 588 and 590 into the surrounding silicon in all directions. Following this, conventional back-end processing steps are followed to complete the fabrication of die 500. As a result, die 586 is similar to die 400.

Figure 5G:
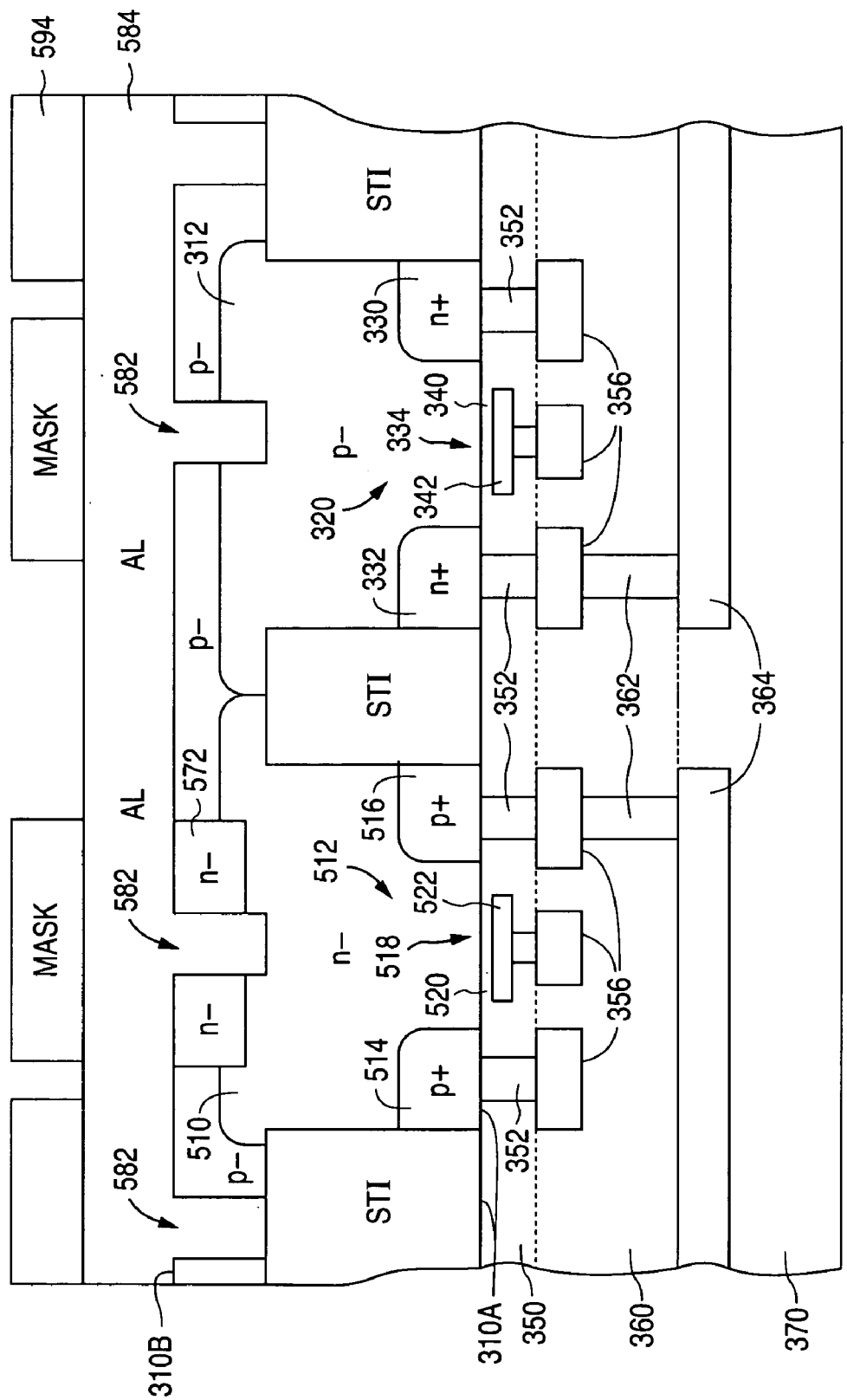

Optionally, as shown in FIG. 5G, rather than back grinding, aluminum 584 can be selectively removed by forming a mask 594 on aluminum 584 that protects the aluminum-filled openings 582. Following the formation of mask 594, the exposed regions of aluminum 584 are etched until aluminum 584 has been removed from bottom surface 310A of p– substrate 310. Mask 594 is then removed, and the process continues as described above.

Figure 5H:
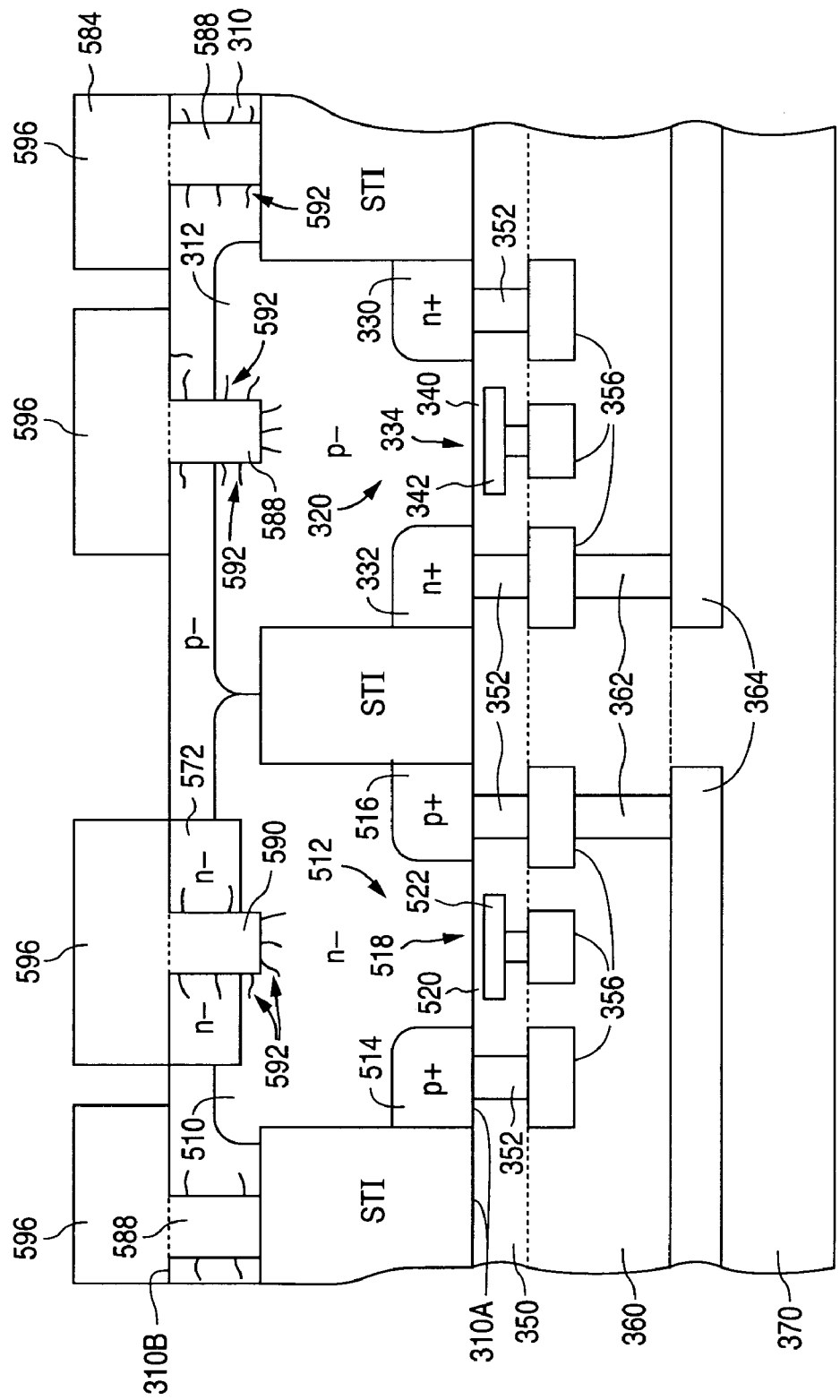

As shown in FIG. 5H, the aluminum etch forms large spaced-apart regions 596 on bottom surface 310A of substrate 310 that are connected to the aluminum plugs 588 and 590. Regions 596 provide a large surface area which, in turn, increases the heat radiation efficiency of aluminum plugs 588 and 590 and spikes 592, which form aluminum-spiked heat pipes. In addition, as further shown in FIG. 5H, spikes 592 also extend from regions 596 following the 900° C. heat treatment.

Thus, an aluminum-spiked heat pipe, and a method of forming an aluminum-spiked heat pipe, have been described in accordance with the present invention to provide a low thermal pathway from hot spots near the top surface of a semiconductor die to the backside of the semiconductor die.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A semiconductor die comprising:
    a silicon region of a first conductivity type, the silicon region having a top surface and a bottom surface;
    a first well of the first conductivity type that contacts the silicon region, the first well having a top surface that contacts the top surface of the silicon region, and a bottom surface spaced apart from the bottom surface of the silicon region, the first well having a dopant concentration greater than a dopant concentration of the silicon region; and
    a first structure extending away from the bottom surface of the silicon region up through the silicon region to contact the first well without touching the top surface of the first well, the first structure having aluminum that contacts the silicon region and the first well, the first structure including:
        a first base region having a side wall and including aluminum; and
        a plurality of spaced-apart spikes extending away from the side wall of the first base region in all directions, and including aluminum.

2. The semiconductor die of claim 1 and further comprising:
    spaced-apart first source and drain regions of a second conductivity type formed in the first well;
    a first channel region of the first conductivity type located between and contacting the first source and drain regions;
    a layer of dielectric material that contacts the top surface of the silicon region over the first channel region; and
    a gate lying over the first channel region that contacts the layer of dielectric material.

3. The semiconductor die of claim 2 and further comprising:
    a second well of the second conductivity type that contacts the silicon region, the second well having a top surface that contacts the top surface of the silicon region, and a bottom surface spaced apart from the bottom surface of the silicon region, the second well having a lower dopant concentration than the first source and drain regions; and
    a junction region of the second conductivity type that has a bottom surface that contacts the bottom surface of the silicon region, and extends up through the silicon region to contact the second well.

4. The semiconductor die of claim 3 and further comprising a second structure extending from the bottom surface of the junction region up through the junction region to contact the second well without touching the top surface of the second well, the second structure having aluminum that contacts the junction region and the second well.

5. The semiconductor die of claim 4 wherein the second structure includes:
    a second base region having a side wall and including aluminum; and
    a plurality of spaced-apart spikes extending away from the side wall of the second base region in all directions, and including aluminum.

6. The semiconductor die of claim 5 and further comprising:
    spaced-apart second source and drain regions of the first conductivity type formed in the second well;
    a second channel region of the second conductivity type located between and contacting the second source and drain regions of the first conductivity type; and
    a gate lying over the second channel region that contacts the layer of dielectric material.

7. A semiconductor die comprising:
    a non-conductive region;
    a first region of a first conductivity type that touches the non-conductive region, the first region having a top surface and a bottom surface;
    a second region of a second conductivity type that touches the non-conductive region, the second region having a top surface and a bottom surface, and including all contiguous regions of the second conductivity type, the bottom surface of the first region and the bottom surface of the second region lying in a single plane;
    a first structure that touches the first region, the first structure including:
        a first base region having a first side wall; and
        a plurality of spaced-apart aluminum spikes that touch the first region, and extend away from the first side wall of the first base region in all directions into the first region; and
    a second structure that extends into the second region from the bottom surface of the second region without touching the top surface of the second region, the second structure including:
        a second base region having a second side wall; and
        a plurality of spaced-apart aluminum spikes that touch the second region and extend away from the second side wall of the second base region in all directions into the second region.

8. The semiconductor die of claim 7 wherein the first region has a substantially uniform dopant concentration.

9. The semiconductor die of claim 8 and further comprising:
    spaced-apart source and drain regions of the first conductivity type formed in the second region;
    a channel region of the second conductivity type located between and contacting the source and drain regions;
    a layer of dielectric material that contacts the top surface of the second region over the channel region; and
    a gate lying over the channel region that contacts the layer of dielectric material.

10. The semiconductor die of claim 8 and further comprising a third region of the first conductivity type that touches the non-conductive region, the third region having a top surface and a bottom surface, the third region having a dopant concentration that is greater than a dopant concentration of the first region.

11. The semiconductor die of claim 10 wherein the third region has a substantially uniform dopant concentration.

12. The semiconductor die of claim 11 wherein the bottom surface of the third region lies above and spaced apart from the bottom surface of the first region.

13. The semiconductor die of claim 12 and further comprising:
  spaced-apart first source and drain regions of a second conductivity type formed in the third region;
  a first channel region of the first conductivity type located between and contacting the first source and drain regions;
  a layer of dielectric material that contacts the top surface of the third region over the first channel region;
  a gate lying over the first channel region that contacts the layer of dielectric material;
  spaced-apart second source and drain regions of the first conductivity type formed in the second region;
  a second channel region of the second conductivity type located between and contacting the second source and drain regions of the first conductivity type; and
  a gate lying over the second channel region that contacts the layer of dielectric material.

* * * * *